United States Patent
Chang et al.

(10) Patent No.: US 9,935,067 B2
(45) Date of Patent: Apr. 3, 2018

(54) METHODS OF FORMING CONNECTOR PAD STRUCTURES, INTERCONNECT STRUCTURES, AND STRUCTURES THEREOF

(71) Applicant: Taiwan Semiconductor Manufacturing Company, Ltd., Hsin-Chu (TW)

(72) Inventors: Chia-Lun Chang, Tainan (TW); Chung-Shi Liu, Hsin-Chu (TW); Hsiu-Jen Lin, Zhubei (TW); Hsien-Wei Chen, Hsin-Chu (TW); Ming-Da Cheng, Jhubei (TW); Wei-Yu Chen, Taipei (TW)

(73) Assignee: Taiwan Semiconductor Manufacturing Company LTD., Hsin-Chu (TW)

( * ) Notice: Subject to any disclaimer, the term of this patent is extended or adjusted under 35 U.S.C. 154(b) by 0 days.

(21) Appl. No.: 15/431,514

(22) Filed: Feb. 13, 2017

(65) Prior Publication Data

US 2017/0154862 A1    Jun. 1, 2017

Related U.S. Application Data

(62) Division of application No. 14/815,584, filed on Jul. 31, 2015, now Pat. No. 9,570,410.

(51) Int. Cl.
*H01L 23/00*       (2006.01)
*H01L 23/538*     (2006.01)
(Continued)

(52) U.S. Cl.
CPC .......... *H01L 24/05* (2013.01); *H01L 21/561* (2013.01); *H01L 21/568* (2013.01);
(Continued)

(58) Field of Classification Search
CPC .......... H01L 2224/0239; H01L 24/05; H01L 2224/13006; H01L 24/10; H01L 23/528; H01L 2224/05548; H01L 2224/16227; H01L 2225/06513; H01L 24/16; H01L 23/3171; H01L 23/3157; H01L 2224/13024; H01L 2224/0401; H01L 2924/00014; H01L 2224/05572; H01L 2924/00; H01L 2924/014; H01L 2224/05647; H01L 23/53233; H01L 23/562; H01L 2224/13111; H01L 23/485; H01L 23/4821; H01L 23/4822;
(Continued)

(56) References Cited

U.S. PATENT DOCUMENTS 7,564,115 B2    7/2009  Chen et al.
7,633,165 B2   12/2009  Hsu et al.
(Continued)

*Primary Examiner* — Jasmine Clark
(74) *Attorney, Agent, or Firm* — Slater Matsil, LLP

(57) ABSTRACT

Methods of forming connector pad structures, interconnect structures, and structures thereof are disclosed. In some embodiments, a method of forming a connector pad structure includes forming an underball metallization (UBM) pad, and increasing a surface roughness of the UBM pad by exposing the UBM pad to a plasma treatment. A polymer material is formed over a first portion of the UBM pad, leaving a second portion of the UBM pad exposed.

20 Claims, 14 Drawing Sheets

(51) Int. Cl.

| | | |
|---|---|---|
| *H01L 23/48* | (2006.01) | |
| *H01L 23/52* | (2006.01) | |
| *H01L 29/40* | (2006.01) | |
| *H01L 23/29* | (2006.01) | |
| *H01L 23/498* | (2006.01) | |
| *H01L 21/56* | (2006.01) | |
| *H01L 21/683* | (2006.01) | |
| H01L 25/065 | (2006.01) | |
| H01L 25/10 | (2006.01) | |

(52) U.S. Cl.
CPC ........ *H01L 21/6835* (2013.01); *H01L 23/293* (2013.01); *H01L 23/49822* (2013.01); *H01L 23/49827* (2013.01); *H01L 23/5383* (2013.01); *H01L 23/5384* (2013.01); *H01L 23/5386* (2013.01); *H01L 23/5389* (2013.01); *H01L 24/03* (2013.01); *H01L 24/11* (2013.01); *H01L 24/13* (2013.01); *H01L 24/19* (2013.01); *H01L 24/20* (2013.01); *H01L 24/97* (2013.01); H01L 23/49816 (2013.01); H01L 24/32 (2013.01); H01L 24/48 (2013.01); H01L 25/0657 (2013.01); H01L 25/105 (2013.01); H01L 2221/68359 (2013.01); H01L 2224/02166 (2013.01); H01L 2224/02175 (2013.01); H01L 2224/0346 (2013.01); H01L 2224/0383 (2013.01); H01L 2224/0391 (2013.01); H01L 2224/03828 (2013.01); H01L 2224/0401 (2013.01); H01L 2224/04042 (2013.01); H01L 2224/04105 (2013.01); H01L 2224/05017 (2013.01); H01L 2224/05025 (2013.01); H01L 2224/05147 (2013.01); H01L 2224/05557 (2013.01); H01L 2224/05559 (2013.01); H01L 2224/05567 (2013.01); H01L 2224/05647 (2013.01); H01L 2224/10156 (2013.01); H01L 2224/11005 (2013.01); H01L 2224/119 (2013.01); H01L 2224/1132 (2013.01); H01L 2224/1181 (2013.01); H01L 2224/11334 (2013.01); H01L 2224/11416 (2013.01); H01L 2224/11424 (2013.01); H01L 2224/11849 (2013.01); H01L 2224/12105 (2013.01); H01L 2224/131 (2013.01); H01L 2224/13026 (2013.01); H01L 2224/13082 (2013.01); H01L 2224/13109 (2013.01); H01L 2224/13111 (2013.01); H01L 2224/13116 (2013.01); H01L 2224/13147 (2013.01); H01L 2224/215 (2013.01); H01L 2224/32145 (2013.01); H01L 2224/32225 (2013.01); H01L 2224/48091 (2013.01); H01L 2224/48227 (2013.01); H01L 2224/73265 (2013.01); H01L 2224/73267 (2013.01); H01L 2225/0651 (2013.01); H01L 2225/06568 (2013.01); H01L 2225/1035 (2013.01); H01L 2225/1041 (2013.01); H01L 2225/1058 (2013.01); H01L 2924/00014 (2013.01); H01L 2924/0105 (2013.01); H01L 2924/01029 (2013.01); H01L 2924/01322 (2013.01); H01L 2924/01327 (2013.01); H01L 2924/06 (2013.01); H01L 2924/0665 (2013.01); *H01L 2924/15311* (2013.01); *H01L 2924/18162* (2013.01)

(58) Field of Classification Search
CPC ............ H01L 23/4824; H01L 23/4825; H01L 23/532; H01L 24/02; H01L 2224/023; H01L 2224/45099; H01L 24/03; H01L 23/293; H01L 2224/11334; H01L 24/13; H01L 2224/0391; H01L 2224/13147; H01L 2224/32225; H01L 2224/32145; H01L 2224/12105; H01L 2224/48227; H01L 2224/73265; H01L 2924/15311; H01L 2224/215; H01L 2224/11005; H01L 2224/0383; H01L 24/32; H01L 24/20; H01L 24/48; H01L 2224/03914
See application file for complete search history.

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,361,842 B2 | 1/2013 | Yu et al. |
| 8,426,961 B2 | 4/2013 | Shih et al. |
| 8,669,174 B2 | 3/2014 | Wu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,802,504 B1 | 8/2014 | Hou et al. |
| 8,803,292 B2 | 8/2014 | Chen et al. |
| 8,803,306 B1 | 8/2014 | Yu et al. |
| 8,803,316 B2 | 8/2014 | Lin et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2007/0015351 A1 | 1/2007 | Tomimori et al. |
| 2011/0291288 A1 | 12/2011 | Wu et al. |
| 2011/0309490 A1* | 12/2011 | Lu .......................... H01L 23/293 257/737 |
| 2012/0061835 A1 | 3/2012 | Hosseini et al. |
| 2012/0248605 A1 | 10/2012 | Yamaguchi |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0001645 A1 | 1/2014 | Lin et al. |
| 2014/0203429 A1 | 7/2014 | Yu et al. |
| 2014/0225222 A1 | 8/2014 | Yu et al. |
| 2014/0225258 A1 | 8/2014 | Chiu et al. |
| 2014/0252572 A1 | 9/2014 | Hou et al. |
| 2014/0252646 A1 | 9/2014 | Hung et al. |
| 2014/0264930 A1 | 9/2014 | Yu et al. |
| 2016/0111384 A1* | 4/2016 | Tseng .................. H01L 23/3142 257/737 |

\* cited by examiner

METHODS OF FORMING CONNECTOR PAD STRUCTURES, INTERCONNECT STRUCTURES, AND STRUCTURES THEREOF

This application is a divisional of and claims priority to U.S. patent application Ser. No. 14/815,584, filed on Jul. 31, 2015, now U.S. Pat. No. 9,570,410, and entitled, "Methods of Forming Connector Pad Structures, Interconnect Structures, and Structures Thereof," which application is incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post-passivation interconnect (PPI) that is used to fan-out wiring for contact pads of the package so that electrical contacts may be made on a larger pitch than contact pads of the integrated circuit. WLPs are often used to package integrated circuits (ICs) that demand high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
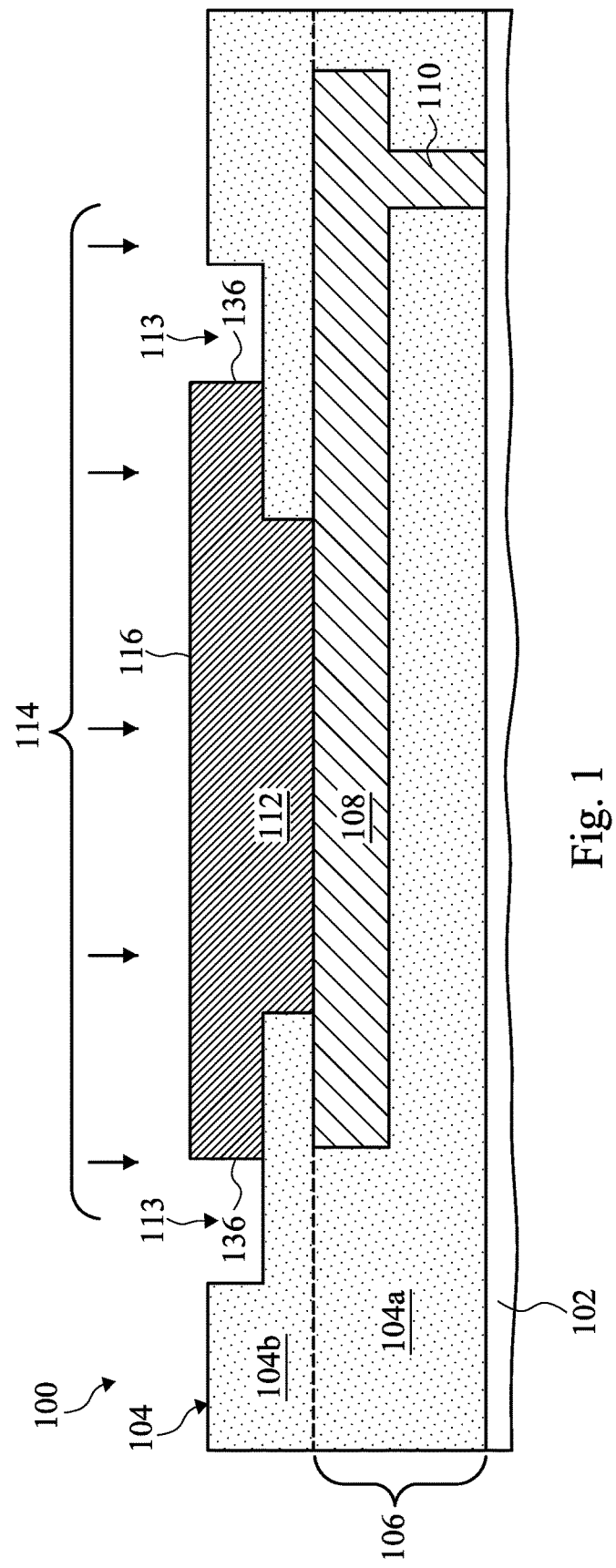
FIGS. 1 through 7 are cross-sectional views of a portion of a packaged semiconductor device at various stages that illustrate a method of forming a connector pad structure and an interconnect structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of forming connector pad structures, methods of forming interconnect structures, interconnect structures, and packaged semiconductor devices that include the connector pad structures and interconnect structures are disclosed in the present disclosure. The connector pad structures and interconnect structures include an intermetallic compound (IMC) that is formed between connectors and underball metallization (UBM) pads, wherein the IMC is not formed between edges of the UBM pads and a polymer material proximate edges of the UBM pads, which improves reliability. Some embodiments are disclosed that utilize connector pad structures and interconnect structures that may be used for the purpose of attaching one substrate to another substrate, wherein the substrates may be a die, wafer, printed circuit board (PCB), packaging substrate, or the like, thereby allowing for die-to-die, wafer-to-die, wafer-to-wafer, die or wafer to printed circuit board, packaging substrate types of packaging, or the like. Throughout the various views and illustrative embodiments, like reference numerals are used to designate like elements.

FIGS. 1 through 7 are cross-sectional views of a portion of a packaged semiconductor device at various stages that illustrate a method of forming a connector pad structure 101 and interconnect structure 100 in accordance with some embodiments of the present disclosure. Referring first to FIG. 1, in some embodiments, an interconnect structure 100 that includes a redistribution layer (RDL) 106 is formed over a carrier 102. The carrier 102 comprises a wafer, tape, or other type of support, substrate, or device that may be used for a packaging process as a platform for packaging one or more integrated circuit dies 152. The carrier 102 is later removed after the packaging process in some embodiments, for example. The carrier 102 includes an integrated circuit die 152 (not shown in FIG. 1; see FIG. 12) that is encapsulated disposed thereon in some embodiments, to be described further herein.

The RDL 106 comprises a plurality of conductive lines 108 and conductive vias 110 formed in a plurality of insulating material layers 104a. One conductive line 108 and one conductive via 110 are shown in FIGS. 1 through 7 and 11; however, a plurality of the conductive lines 108 and conductive vias 110 are formed over the carrier 102. The RDL 106 comprises a post-passivation interconnect (PPI) structure in some embodiments, wherein the conductive lines 108 comprise PPI lines, for example. The RDL 106 may also comprise other types of wiring. The RDL 106 provides electrical connections in a horizontal direction for a packaged semiconductor device (see packaged semiconductor device 150 shown in FIG. 12) in some embodiments, for example.

Referring again to FIG. 1, the plurality of insulating material layers 104a may comprise a dielectric material such as $SiO_2$, SiN, plasma-enhanced oxide (PEOX), plasma-enhanced SiN (PE-SiN), plasma-enhanced undoped silicate glass (PE-USG), polybenzoxazole (PBO), polyimide (PI), epoxy, benzocyclobutene (BCB), molding compound, and the like, or a combination of multiple layers thereof. The conductive lines 108 and conductive vias 110 may comprise a conductive material such as copper, a copper alloy, or other metals or conductive materials in some embodiments that is formed using a plating process or other deposition process within the insulating material layers 104a. The plurality of insulating material layers 104a is patterned using one or more lithography processes, which can include forming a layer of photoresist (not shown) over the plurality of insulating material layers 104a, and exposing the photoresist to light or energy reflected from or through a lithography mask (also not shown) having a desired pattern thereon. The photoresist is then developed, and exposed (or unexposed, depending on whether the photoresist is a positive or negative photoresist) portions of the photoresist are removed to form a patterned layer of photoresist. The patterned layer of photoresist is then used as an etch mask during an etch process for the plurality of insulating material layers 104a. The layer of photoresist is then removed using an ashing and/or etch process.

The conductive lines 108 and conductive vias 110 may comprise a thin layer, e.g., comprising a thickness of about 2 µm to about 3 µm or less, of titanium or other seed material that is formed using a sputtering process, and a layer of copper, a copper alloy, or other metal that is electro-plated over the layer of titanium, in some embodiments. In other embodiments, the conductive lines 108 and conductive vias 110 may comprise a multi-layered structure, such as a copper layer coated with electro-less nickel or electro-less palladium immersion gold (ENEPIG), which includes a nickel layer, a palladium layer on the nickel layer, and a gold layer on the palladium layer. The gold layer may be formed using immersion plating. The conductive lines 108 and conductive vias 110 may also comprise other materials, dimensions, and formation methods. The plurality of insulating material layers 104a is then formed around the conductive lines 108 and conductive vias 110.

In some embodiments, the conductive lines 108 and conductive vias 110 may be deposited and patterned using a lithography process, similar to the lithography process described for the plurality of insulating material layers 104a, using an etch chemistry suited for the material of the conductive lines 108 and conductive vias 110. For example, a conductive material may be formed as a blanket coating and then etched using a lithography process to pattern the conductive lines 108 and conductive vias 110.

A plurality of insulating material layers 104b is formed over the conductive lines 108 and conductive vias 110 and the plurality of insulating material layers 104a. The plurality of insulating material layers 104b may comprise similar materials as described for the plurality of insulating material layers 104a, for example. The plurality of insulating material layers 104a and 104b are labeled collectively as an insulating material 104 in some of the drawings of the present disclosure. The plurality of insulating material layers 104b is patterned using lithography to expose a portion of the conductive lines 108.

A plurality of UBM pads 112 is formed over the RDL 106. One UBM pad 112 is shown in FIGS. 1 through 7 and 11; however, a plurality of the UBM pads 112 is formed over the carrier 102 over the RDL 106. The plurality of UBM pads 112 is electrically and mechanically coupled to the conductive lines 108 of the RDL 106. Each of the plurality of UBM pads 112 may be coupled to one of the conductive lines 108, for example, as shown in FIG. 1. Each of the plurality of UBM pads 112 may also be coupled to one of the conductive vias 110 (not shown), or each of the plurality of UBM pads 112 may also be coupled to one of the conductive lines 108 and/or conductive vias 110, for example.

The plurality of UBM pads 112 comprises copper, a copper alloy, or other metals in some embodiments, for example, that is formed using a plating process, as described for the conductive lines 108 and conductive vias 110 of the RDL 106. The plurality of UBM pads 112 may comprise a thickness of about 5 µm to about 7 µm, for example. The plurality of UBM pads 112 may also comprise other materials, dimensions, and formation methods. The plurality of UBM pads 112 is formed within the plurality of insulating material layers 104b over the RDL 106, for example. Each of the plurality of UBM pads 112 is adapted to have a connector 132 (see FIG. 5) coupled thereto. In some embodiments, an upper portion of the plurality of insulating material layers 104b comprises a recess 113 proximate edges 136 of the plurality of UBM pads 112. The recess 113 proximate the edges 136 of the plurality of UBM pads 112 will later be filled with a polymer material 120 (see FIG. 3), for example. In other embodiments, a recess 113 is not included in the insulating material layers 104b proximate the edges 136 of the plurality of UBM pads 112, not shown.

The RDL 106 and the plurality of UBM pads 112 are formed using a wafer level package (WLP) process in some embodiments, for example.

Referring again to FIG. 1, the plurality of UBM pads 112 comprises a first surface roughness 116. The first surface roughness 116 of the plurality of UBM pads 112 has an average surface roughness or $R_a$ of less than about 0.18 μm in some embodiments, after the formation of the plurality of UBM pads 112, for example. The first surface roughness 116 may also comprise other values. The first surface roughness 116 of the plurality of UBM pads 112 has an initial surface roughness after the formation of the plurality of UBM pads 112, for example.

The first surface roughness 116 of the plurality of UBM pads 112 is increased to a higher level of roughness or a more increased surface roughness in accordance with some embodiments. The first surface roughness 116 of the top surface of the plurality of UBM pads 112 is altered to a second surface roughness 118 (see FIG. 2), the second surface roughness 118 being greater than the first surface roughness 116, in some embodiments, for example.

Figure 2:
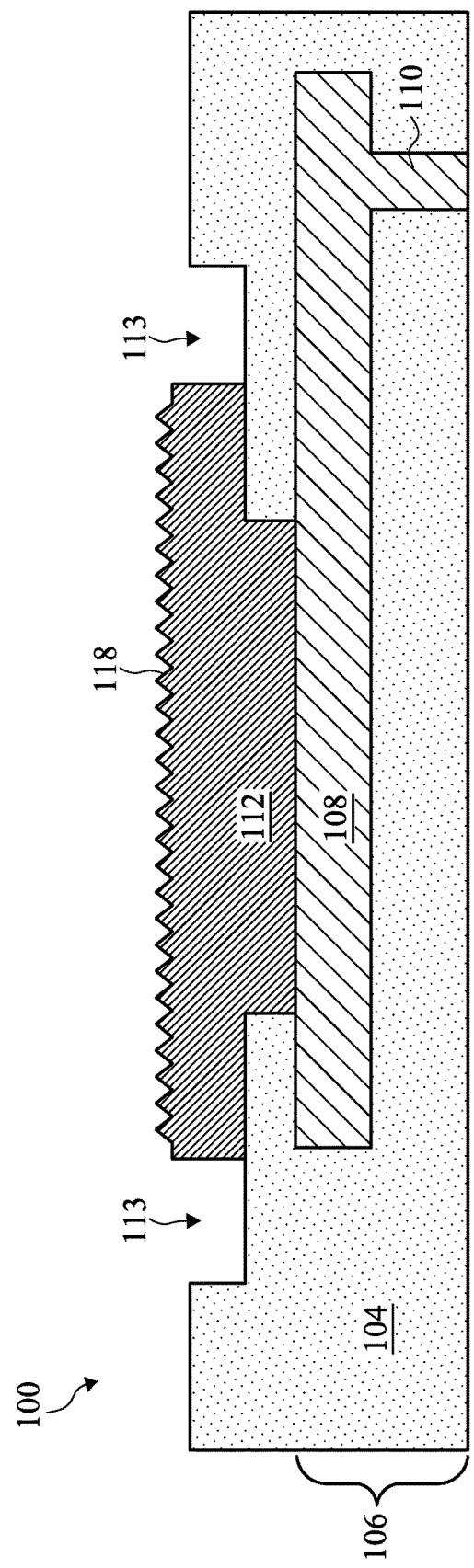

To alter the first surface roughness 116, the plurality of UBM pads 112 is exposed to a plasma treatment 114 in some embodiments, as shown in FIG. 1. The plasma treatment 114 comprises a duration time of about 100 seconds or less in the presence of $N_2$ and at a chamber temperature of about 50 degrees C. to about 100 degrees C. in some embodiments, for example. The plasma treatment 114 may also comprise other processing parameters. The first surface roughness 116 of the plurality of UBM pads 112 is increased to the second surface roughness 118 by the plasma treatment 114 in some embodiments, as illustrated in FIG. 2. The plasma treatment 114 roughens the UBM pad 112 surface, for example. The second surface roughness 118 has an average surface roughness or $R_a$ of about 0.18 μm to about 0.25 μm in some embodiments, for example. The second surface roughness 118 is a value sufficient to improve adhesion of a subsequently deposited polymer material 120 (see FIG. 3), for example. The second surface roughness 118 may also be other values. The first surface roughness 116 of the plurality of UBM pads 112 may also be altered using other methods, such as by altering a plating process condition, as an example.

Figure 3:
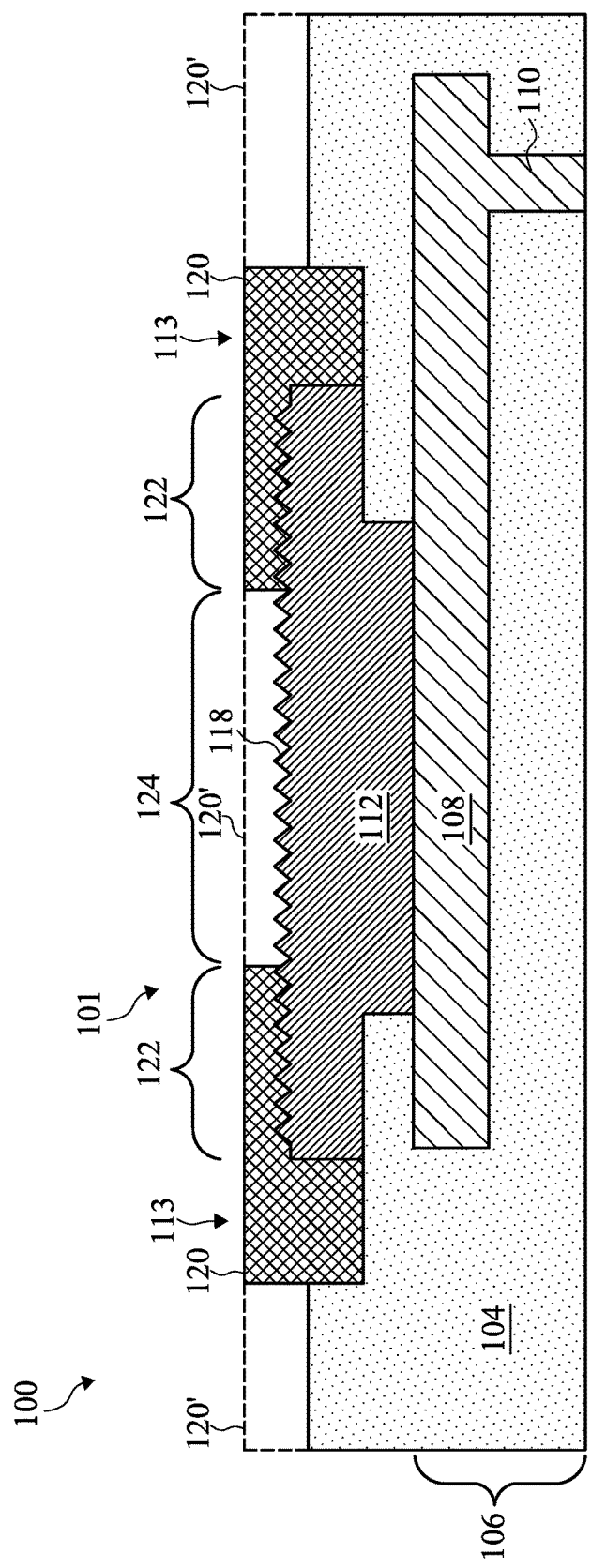

The polymer material 120 is then formed over the insulating material 104 and a first portion 122 of the plurality of UBM pads 112, as shown in FIG. 3. The polymer material 120 may be formed using a blanket deposition process, for example. The polymer material 120 is substantially conformal in some embodiments and substantially covers an entire surface of the interconnect structure 100, as shown in phantom (e.g., in dashed lines) in FIG. 3 at 120'. The polymer material 120 comprises an insulating material such as PBO, PI, epoxy, BCB, molding compound, and/or a combination thereof, as examples. The polymer material 120 may comprise a thickness over the plurality of UBM pads 112 of about 6 μm to about 8 μm, for example. The polymer material 120 may also comprise other materials, dimensions, and formation methods.

The polymer material 120 is patterned using a lithography process, leaving the polymer material 120 in predetermined locations over the interconnect structure 100. The polymer material 120 is patterned to expose a second portion 124 of the plurality of UBM pads 112. The polymer material 120 is left remaining on a first portion 122 of the plurality of UBM pads 112, and the second portion 124 of the plurality of UBM pads 112 is left exposed. The polymer material 120 is disposed over the surfaces of the plurality of UBM pads 112 over the first portion 122 of the plurality of UBM pads 112. The increased roughness (i.e., the second surface roughness 118) of the plurality of UBM pads 112 advantageously increases adhesion between the polymer material 120 and the first portion 122 of the plurality of UBM pads 112, forming a more robust interface of the polymer material 120 and the first portion 122 of the plurality of UBM pads 112 in some embodiments.

In some embodiments, the first portion 122 of the plurality of UBM pads 112 comprise edge regions of the plurality of UBM pads 112, and the second portion 124 of the plurality of UBM pads 112 comprise substantially central regions of the plurality of UBM pads 112, for example. The first portion 122 and the second portion 124 of the plurality of UBM pads 112 may also comprise other regions of the plurality of UBM pads 112.

In some embodiments, a method of forming a connector pad structure 101 shown in FIG. 3 includes forming a UBM pad 112, and exposing the UBM pad 112 to the plasma treatment 114 as shown in FIG. 1. The method includes forming the polymer material 120 over the first portion 122 of the UBM pad 112 yet leaving the second portion 124 of the UBM pad 112 exposed. In some embodiments, a method of forming a connector pad structure 101 may further comprise forming a flux 128 over the exposed second portion 124 of the UBM pads 112, as shown in FIGS. 4 and 5, which will next be described.

Figure 4:
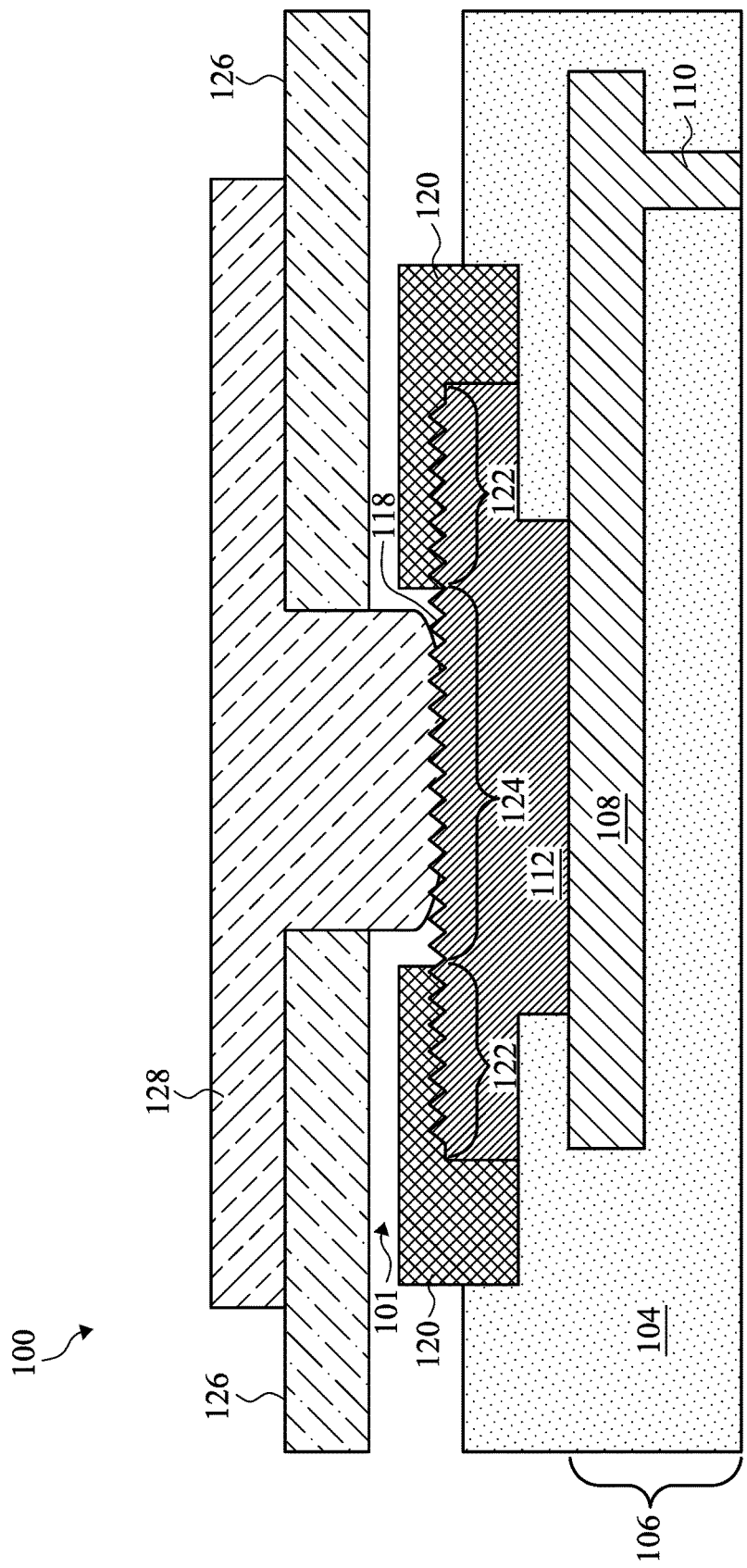

In some embodiments, a flux stencil 126 is provided and is disposed proximate the interconnect structure 100, as illustrated in FIG. 4. The flux stencil 126 (i.e., an opening in the flux stencil 126) is placed proximate each of the plurality of UBM pads 112, for example. Openings in the flux stencil 126 are disposed proximate the exposed second portions 124 of the plurality of UBM pads 112. The flux 128 is then applied using a method such as printing the flux 128 over the plurality of UBM pads 112, for example. The flux 128 may be applied using a flat, smooth blade such as a squeegee over the flux stencil 126, for example. The flux 128 may also be applied using other methods or tools. The flux stencil 126 is then removed.

The flux 128 comprises a low activity flux in some embodiments that is adapted to not damage or react with an interface region of the plurality of UBM pads 112 and the polymer material 120 disposed over the first portions 122 of the plurality of UBM pads 112, in some embodiments. The flux 128 does not damage or react with the interface region because the low activity flux 128 comprises a material that does not react with the polymer material 120. The flux 128 comprises a material that is adapted to improve a connection of a subsequently formed connector 132 (see FIG. 5) over the plurality of UBM pads 112, in some embodiments. The flux 128 improves the connection of the connector 132 by deoxidizing a native oxide layer on the UBM pad 112 surface in some embodiments, for example. The flux 128 comprises a material that is adapted to assist in and facilitate a removal of oxide from a surface of the plurality of UBM pads 112, if oxide is present, in some embodiments, for example. The flux 128 may comprise a thickness of about 10 μm or less after the flux 128 is formed over the second portions 124 of the plurality of UBM pads 112 in some embodiments, for example. The flux 128 may also comprise other properties, types of materials, and dimensions.

Figure 5:
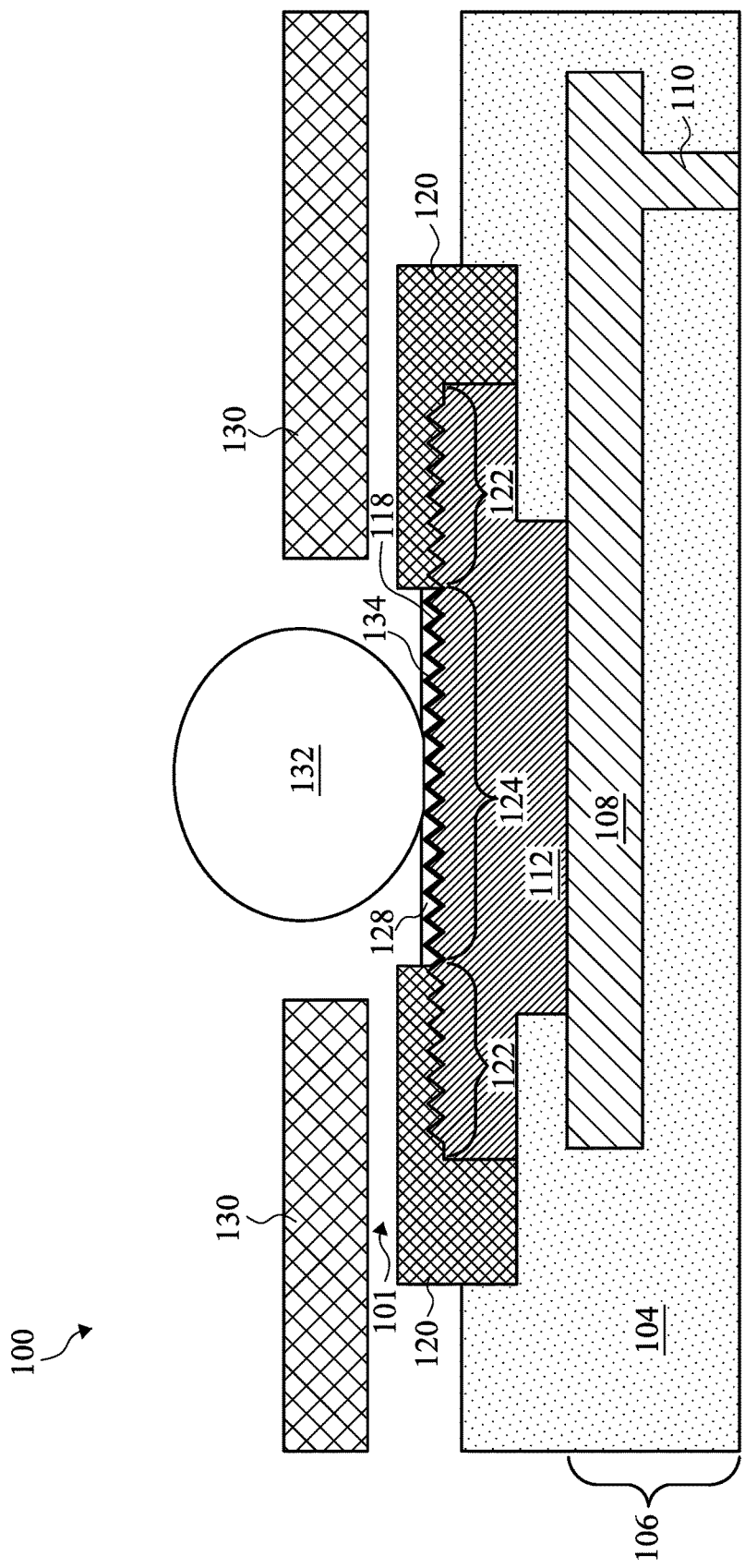

Before, during, and/or after the flux 128 is applied, an oxide layer 134 may form over a top surface of the second portion 124 of the plurality of UBM pads 112, as shown in FIG. 5. The oxide layer 134 may form due to oxidation of the exposed top surface of the plurality of UBM pads 112, for example. The oxide layer 134 may comprise a material of the plurality of UBM pads 112 and oxygen, such as $CuO_2$, for example. The oxide layer 134 may comprise a native oxide in some embodiments, for example. The oxide layer 134 may comprise a thickness of a few μm, such as about 300 Angstroms to about 1 μm or less, for example. The oxide layer 134 may also comprise other materials and dimensions. The flux 128 advantageously assists in the removal of the oxide layer 134 during a subsequent reflow process for a connector 132 in some embodiments. In some embodiments, an oxide layer 134 is not formed.

Figure 6:
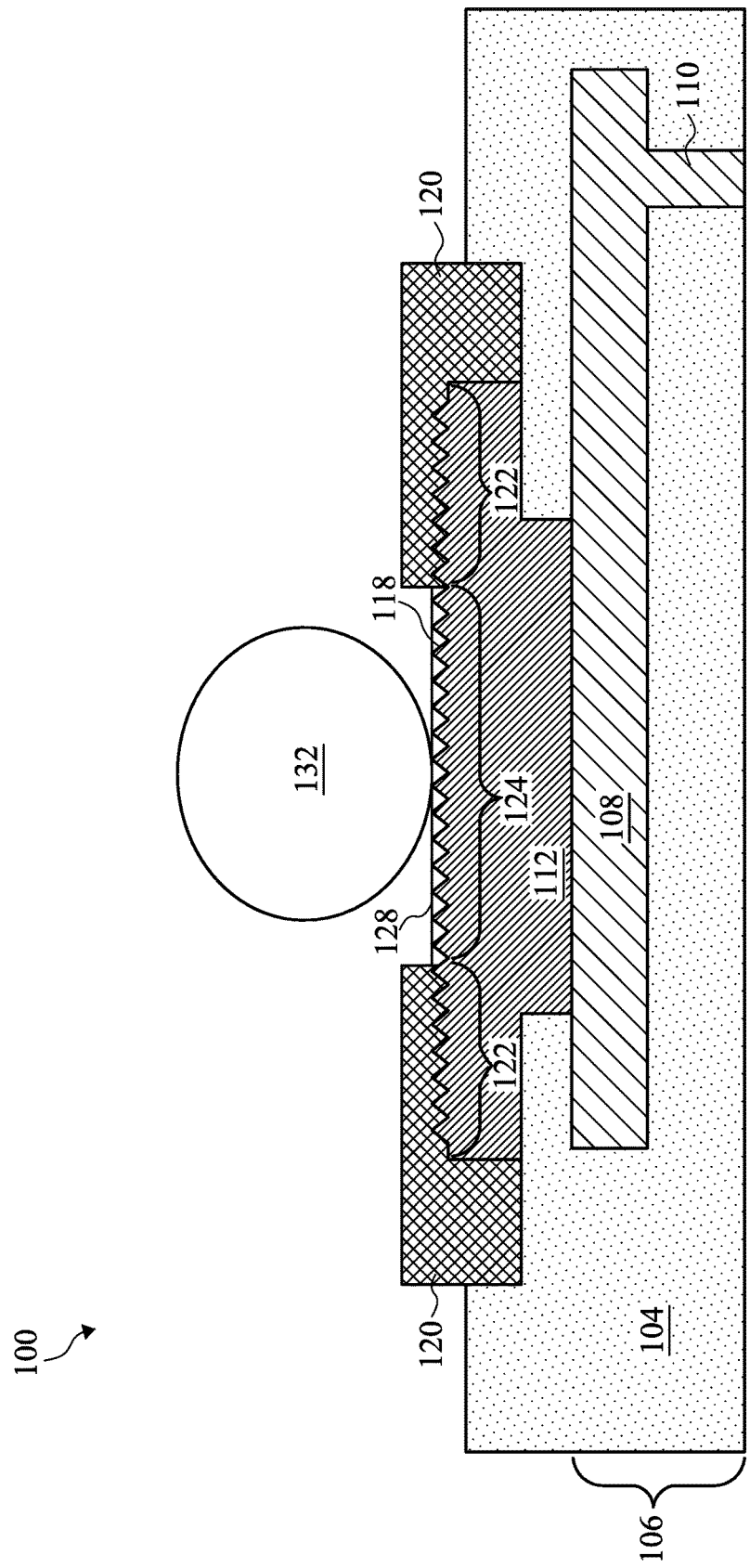

After the application of the flux 128, as shown in FIG. 4, a stencil 130 is placed proximate the interconnect structure 100 in some embodiments, as shown in FIG. 5. The stencil 130 comprises a solder ball stencil in some embodiments, for example. The stencil 130 may also comprise other types of stencils. The stencil 130 is placed proximate the plurality of UBM pads 112, for example. A material of a connector 132 is then applied (i.e., brushed on or other methods) onto the flux 128 residing over the plurality of UBM pads 112, through openings in the stencil 130, forming a connector 132 over each of the plurality of UBM pads 112. After the formation of the material of the connectors 132, the stencil 130 is removed, as shown in FIG. 6. In some embodiments, a stencil 130 is not used to attach the material of the connectors 132, as another example. The connectors 132 may be attached using a ball mount process in some embodiments, for example. The material of the connectors 132 may also be applied using a spin-on process, a solder bath, or solder paste printing, as examples. The material of the connector 132 may also be formed using other methods and may comprise other materials.

The material of the connectors 132 comprises a eutectic material such as solder. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder connectors may also include tin and silver, Sn—Ag, without the use of copper.

The connectors 132 over the plurality of UBM pads 112 are coupled in a substantially central region of the second portions 124 of the plurality of UBM pads 112 in some embodiments after the formation of the material of the connectors 132, as illustrated in FIG. 5. The material of the connectors 132 may not be coupled to edge regions of the second portions 124 of the plurality of UBM pads 112 in some embodiments after the formation of the material of the connectors 132, which is also illustrated in FIG. 5.

The material of the connectors 132 is then heated to a predetermined temperature, e.g., to a melting point of the eutectic material of the material of the connectors 132, such as about 150 degrees C. to about 270 degrees C., to reflow the material of the connectors 132. The connector 132 material may be heated by heating the interconnect structure 100, which causes the flux 128 to interact with the oxide layer 134 (if present) and a top surface of the plurality of UBM pads 112, resulting in the removal of the oxide layer 134, which is illustrated in FIG. 6. The interconnect structure 100 is continued to be heated until a melting point of a eutectic material of the material of the connector 132 is reached, causing a reflow of the material of the connectors 132 and an electrical and mechanical connection of a connector 132 to each of the plurality of UBM pads 112, as illustrated in FIG. 7.

In some embodiments, the connectors 132 may comprise solder bumps or solder balls, as examples. The connectors 132 comprise conductive balls having a shape of a partial sphere in some embodiments. The connectors 132 may have a height of about 170 μm or less in some embodiments, for example. The connectors 132 may also comprise other dimensions and shapes. The connectors 132 may also comprise non-spherical conductive connectors, for example. The connectors 132 may be included in an array of the connectors 132 as a grid, referred to as a "ball grid array" or "BGA". The connectors 132 may also be arranged in other shapes.

The reflow of the material of the connectors 132 improves adhesion of the connectors 132 to the UBM pads 112 and more completely attaches the connectors 132 to the plurality of UBM pads 112. The reflow process results in the material of the connectors 132 being coupled over central regions and also edge regions of the second portions 124 of the UBM pads 112 in some embodiments, as illustrated in FIG. 7. In some embodiments, a portion of the flux 128 comprising a flux residue 128' is left residing around the edges of the connectors 132 after the reflow process, which is also illustrated in FIG. 7. In accordance with some embodiments, the flux residue 128' is then removed using a cleaning process, which will be described further herein.

Figure 7:
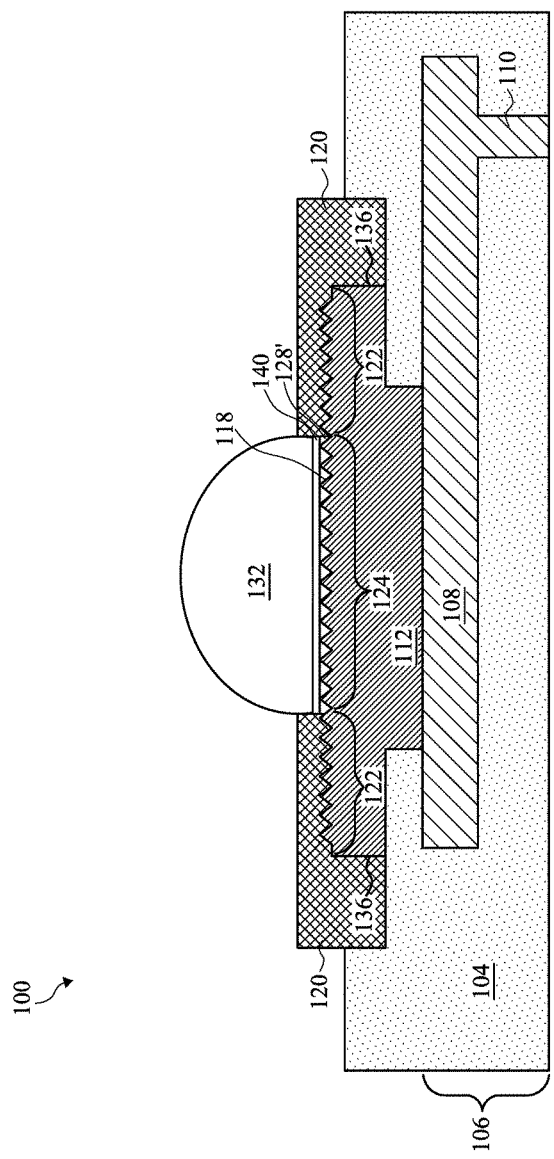

FIG. 7 also illustrates an IMC 140 that is formed between the connectors 132 and the plurality of UBM pads 112 during the reflow of the eutectic material of the connectors 132. The IMC 140 is disposed over the surfaces of the plurality of UBM pads 112 over the second portions 124 of the plurality of UBM pads 112. The IMC 140 is advantageously not formed between the first portions 122 of the plurality of UBM pads 112 and the polymer material 120 in some embodiments, due to the increased second surface roughness 118 of the top surface of the plurality of UBM pads 112, in accordance with some embodiments of the present disclosure. Using a flux 128 comprising a low activity flux further assists in reducing or preventing a portion of the IMC 140 from forming over the first portions 122 of the plurality of UBM pads 112, between the polymer material 120 and the first portions 122 of the plurality of UBM pads 112, in some embodiments, for example. Reflowing the material of the connectors 132 does not comprise forming the IMC 140 between the first portions 122 of the plurality of UBM pads 112 and the polymer material 120 in some embodiments, for example.

The IMC 140 may comprise CuSn, for example, in some embodiments wherein the connectors 132 comprise Sn. The IMC 140 may comprise CuSn, $Ag_3Sn$, $Cu_3Sn$, $Cu_6Sn_5$ in some embodiments, as examples. The IMC 140 may comprise a thickness of about 0.5 μm to about 2 μm in some embodiments, or about 0.75 μm in some embodiments, as examples. The IMC 140 comprises a material and dimension sufficient to improve electrical connection of the connectors 132 to the plurality of UBM pads 112, for example.

Figure 8:
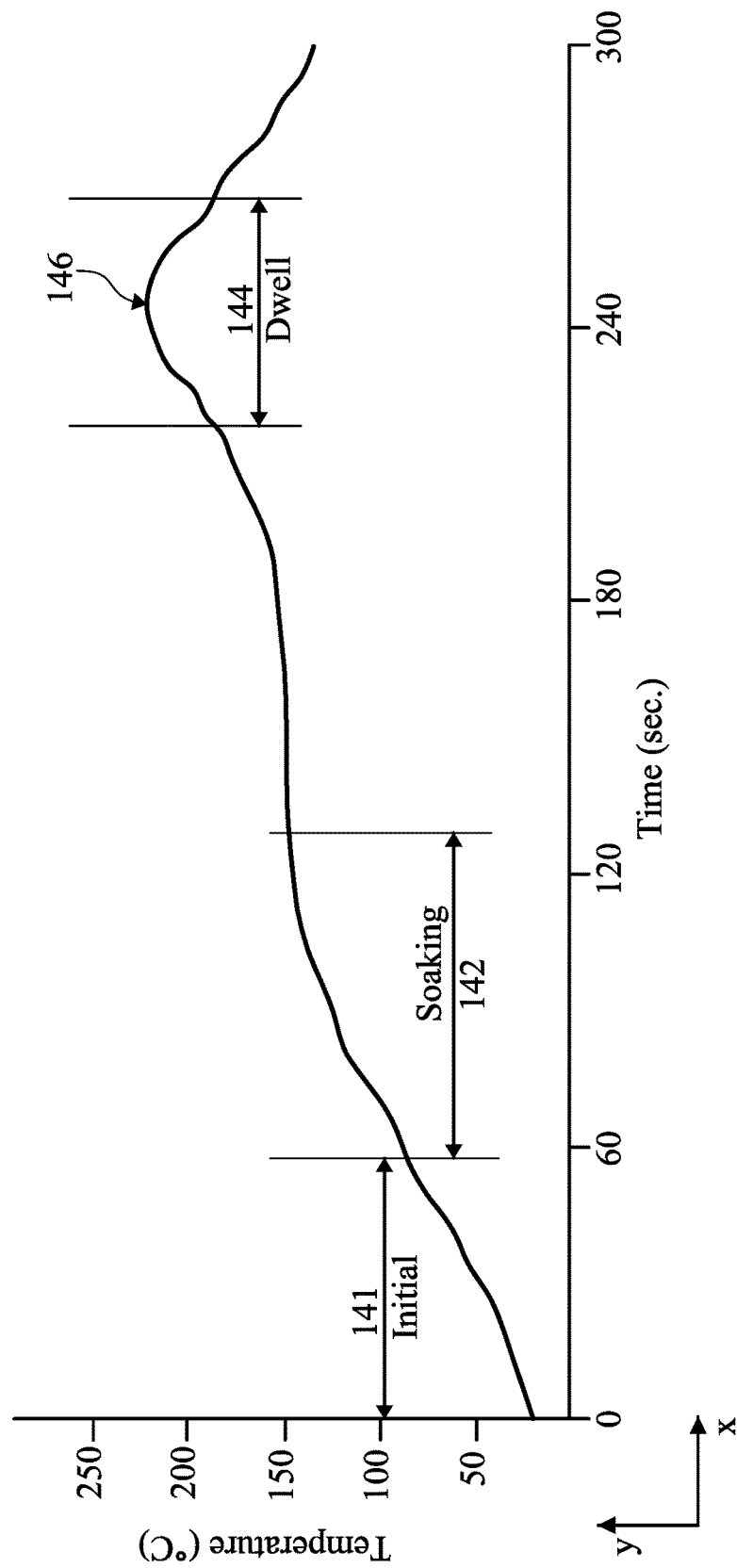
FIG. 8 is a graph showing stages of a reflow process for a material of a connector in accordance with some embodiments.

FIG. 8 is a graph that shows some stages of a reflow process for a material of the connector 132 in accordance with some embodiments. Time in seconds (sec.) is illustrated on an x-axis of the graph, and temperature in degrees C. is illustrated on a y-axis of the graph. The time period between zero and about 60 seconds comprises an initial region 141 wherein the material of the connector 132 is initially heated. The time period between about 60 seconds and about 130 seconds comprises a soaking region 142. The duration of the soaking region 142 comprises about 70 seconds in some embodiments, as an example. As the temperature is increased over time, the connector 132 reaches a dwell region 144 at about 240 seconds plus or minus about 20 seconds, at which point a eutectic material of the connector 132 reflows. The duration of the dwell region 144 comprises about 50 seconds in some embodiments, as an example. The dwell region 144 comprises a peak temperature 146 at which the material of the connector 132 is melted, for example. The peak temperature 146 comprises about 220 degrees C. in the example shown. A melting temperature comprising the peak temperature 146 may comprise about 200 degrees C. to about 250 degrees C. in some embodiments, as another example, depending on the material used for the plurality of connectors 132, for example. The peak temperature 146 and the durations of the soaking region 142 and the dwell region 144 may also comprise other values. The temperature is then lowered, and the eutectic material of the connector 132 resolidifies, mechanically and electrically coupling the connector 132 to substantially the entire exposed top surfaces of the plurality of UBM pads 112, e.g., over the second portions 124 of the plurality of UBM pads 112, over the IMC 140, in some embodiments.

The use of a low activity flux material for the flux 128 may prevent interface damage between the polymer material 120 and the first portions 122 of the plurality of UBM pads 112 during the soaking region 142 of the reflow process. Thus, migration of the material of the connectors 132 into the interface of the polymer material 120 and the first portions 122 of the plurality of UBM pads 112 during the dwell region 144 of the reflow process is prevented, in some embodiments.

Figure 9:
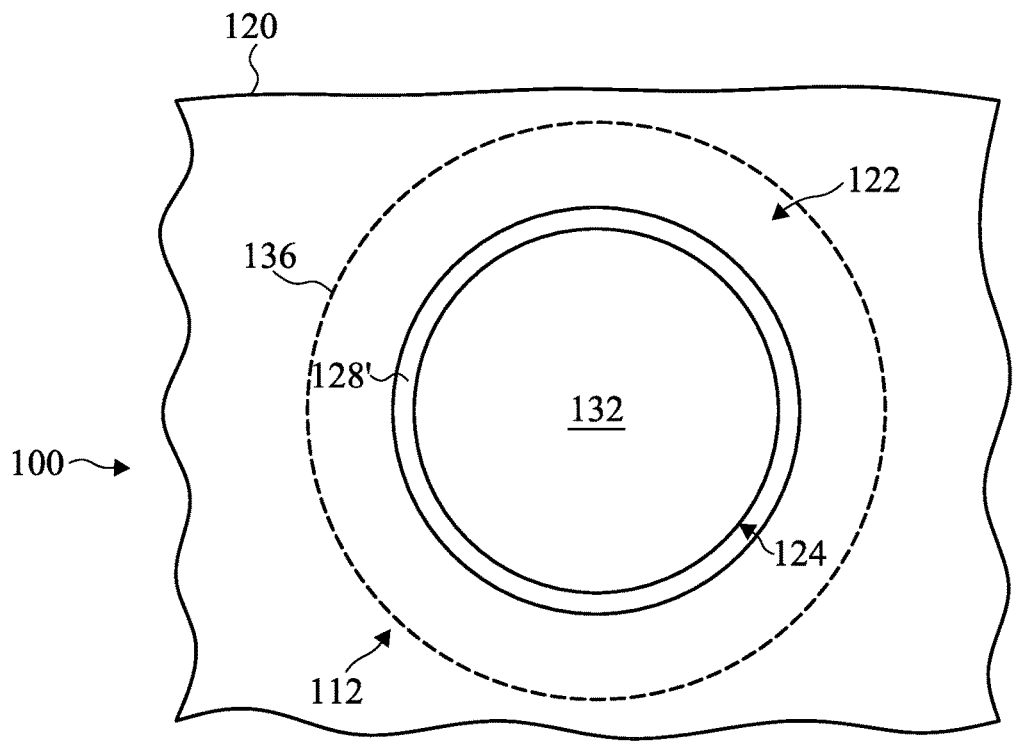
FIG. 9 shows a top view of a connector shown in FIG. 7 that includes a flux residue disposed around edges thereof in accordance with some embodiments.

FIG. 9 shows a top view of a connector 132 attached to one of the plurality of UBM pads 112 shown in FIG. 7 that includes a flux residue 128' disposed around edges of the connector 132 in accordance with some embodiments. Edges 136 of the UBM pad 112 extend past the connector 132 and the flux residue 128'. The first portion 122 of the UBM pad 112 extends past the second portion 124 towards the edges 136 of the UBM pad 112. In accordance with some embodiments of the present disclosure, the interconnect structure 100 is cleaned using a cleaning process to remove the flux residue 128'. The flux residue 128' is cleaned using a flux cleaning machine in some embodiments, for example. The flux residue 128' may also be removed using other devices and methods.

Figure 10:
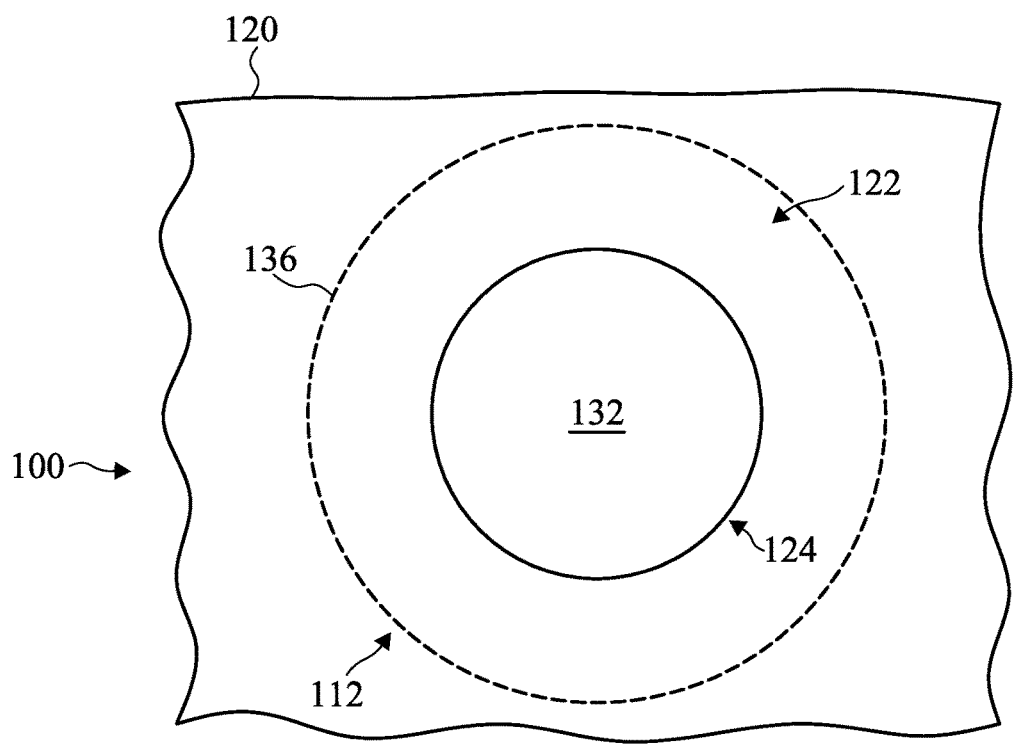
FIG. 10 shows the connector shown in FIG. 9 after a removal of the flux residue in accordance with some embodiments.
Figure 11:
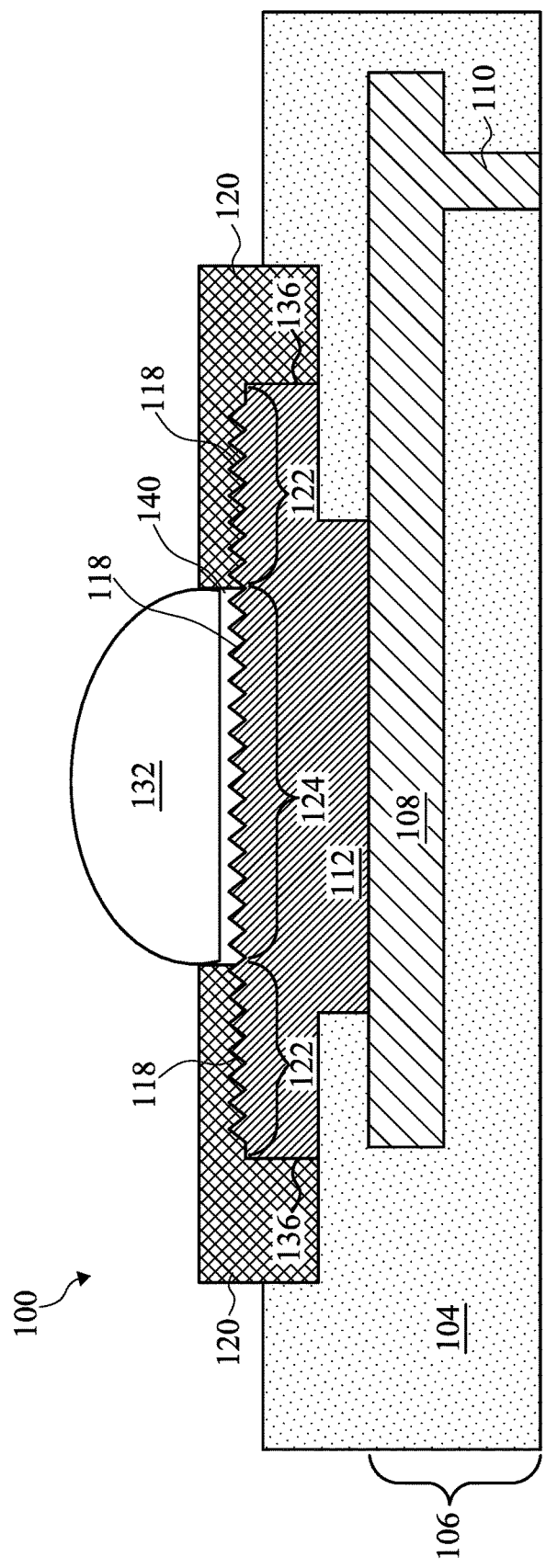
FIG. 11 shows a cross-sectional view of the connector shown in FIG. 10 in accordance with some embodiments.

FIG. 10 shows a top view of the connector 132 shown in FIG. 9 after the removal of the flux residue 128' using the cleaning process in accordance with some embodiments. FIG. 11 is a cross-sectional view of the connector 132 shown in FIG. 10 in accordance with some embodiments. The oxide layer 134 has been removed by the flux 128 during the reflow process for the connector 132. The increased second surface roughness 118 improves the adhesion between the polymer material 120 and the first portion 122 of the UBM pad 112 so that the IMC 140 is advantageously not formed between the polymer material 120 and the first portion 122 of the UBM pad 112, which improves reliability.

Figure 12:
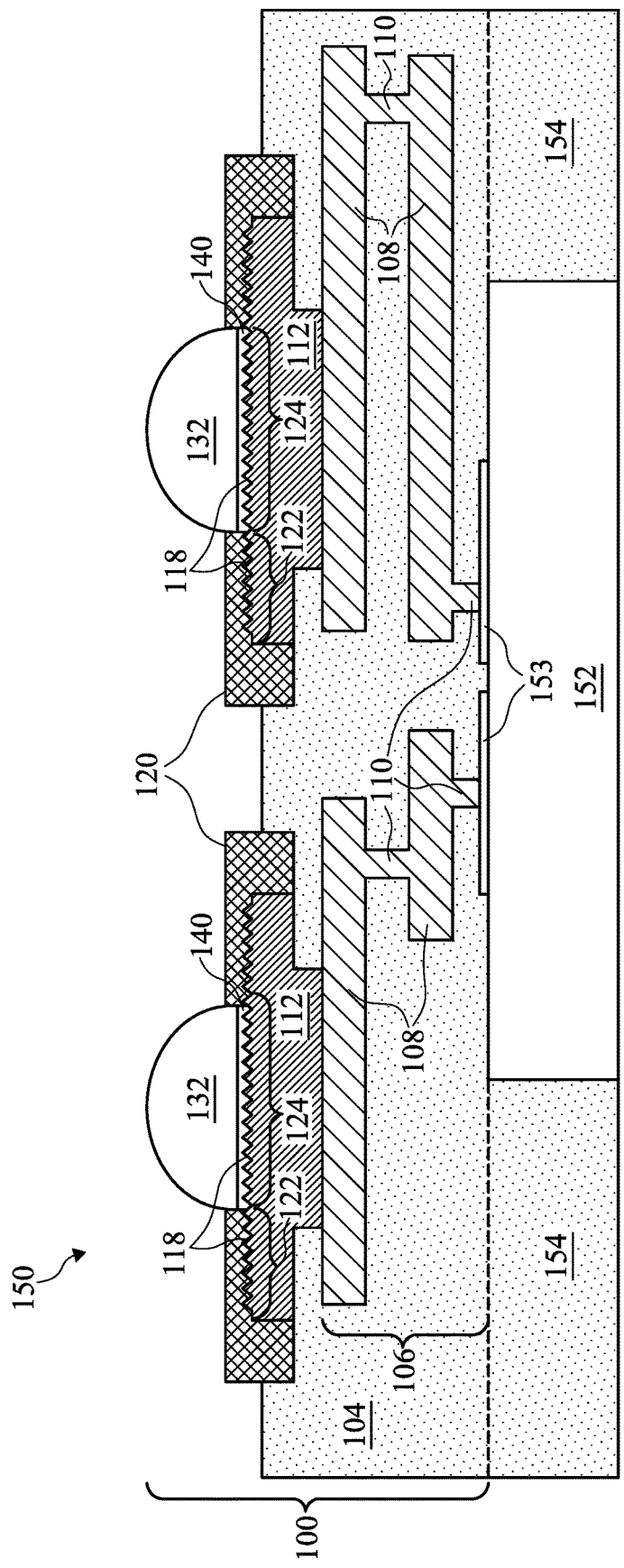
FIG. 12 illustrates a cross-sectional view of a portion of a packaged semiconductor device that includes a plurality of the connectors shown in FIG. 11 in accordance with some embodiments.

FIG. 12 illustrates a cross-sectional view of a portion of a packaged semiconductor device 150 that includes a plurality of the connectors 132 shown in FIG. 11 in accordance with some embodiments. The interconnect structure 100 includes a plurality of the connectors 132 coupled to a plurality of UBM pads 112. The IMC 140 is formed between the second portions 124 of the plurality of UBM pads 112 and the plurality of connectors 132. The IMC 140 is advantageously not formed between the polymer material 120 and the first portions 122 of the plurality of UBM pads 112.

FIG. 12 also illustrates some additional elements of the packaged semiconductor device 150 in accordance with some embodiments of the present disclosure. The packaged semiconductor device 150 includes an interconnect structure 100 coupled to an integrated circuit die 152, and a molding material 154 disposed around the integrated circuit die 152 and beneath the interconnect structure 100. The packaged semiconductor device 150 comprises fan-out structures in some embodiments. For example, conductive wiring of the interconnect structure 100 (e.g., such as the conductive lines 108 and conductive vias 110 of the RDL 106) may be spaced apart farther than conductive wiring of the integrated circuit die 152 is spaced. Likewise, the footprint of UBM pads 112 of the interconnect structure 100 may be larger than the footprint of contacts pads 153 of the integrated circuit die 152. The packaged semiconductor device 150 comprises an integrated fan-out (InFO) device or a WLP device in some embodiments. The packaged semiconductor device 150 may also comprise other types of packages.

To package the integrated circuit die 152, in some embodiments, after the carrier 102 shown in FIG. 1 is provided, before the interconnect structure 100 is formed over the carrier 102, an integrated circuit die 152 is provided and is coupled to the carrier 102. The integrated circuit die 152 may comprise a substrate having electrical circuitry formed within or thereon. The substrate may comprise, for example, doped or undoped bulk silicon or an active layer of a semiconductor-on-insulator (SOI) substrate. The electrical circuitry of the substrate of the integrated circuit die 152 may be any type of circuitry suitable for a particular application. The integrated circuit die 152 may comprise a logic, memory, processor, or other type of device. As other examples, electrical circuitry formed within or on the substrate of the integrated circuit die 152 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other circuitry may be used as appropriate for a given application. The integrated circuit die 152 typically has been fabricated by forming a plurality of the integrated circuit dies 152 on a semiconductor wafer, and singulating the individual integrated circuit dies 152 along scribe lines.

The packaging process for the integrated circuit die 152 in some embodiments comprises providing the carrier 102, and attaching one or more integrated circuit dies 152 to the carrier 102. The carrier 102 is later removed after packaging a plurality of the integrated circuit dies 152 in some embodiments, for example.

In some embodiments, through-vias (not shown in FIG. 12; see through-vias 156 shown in FIG. 13) are also formed over the carrier 102. The through-vias 156 may be plated on a seed layer (not shown) formed on the carrier 102, for example. In some embodiments, through-vias 156 are not included. A plurality of the through-vias 156 may be formed in some embodiments over the carrier 102 by plating, lithography and subtractive etch processes, or other methods, before or after a plurality of the integrated circuit dies 152 is coupled to the carrier 102. The plurality of through-vias 156 may be formed using an electro-plating process, by depositing a seed layer over the carrier 102, and forming a patterned mask with a desired pattern for the through-vias 156 over the seed layer. The through-vias 156 are plated onto the carrier 102 through the patterned mask, and the patterned mask is then removed. The exposed portions of the seed layer are also removed. The through-vias 156 may comprise copper, a copper alloy, or other metals or conductive materials. Dozens or hundreds of through-vias 156 may be included in a package for each of the integrated circuit dies 152 or groups of integrated circuit dies 152 that are packaged together, for example. The plurality of through-vias 156 provides electric connections in a vertical direction for the packaged semiconductor devices 150 in some embodiments. Each of the plurality of through-vias 156 may be positioned so that they will be coupled to a conductive portion of the interconnect structure 100, such as conductive lines 108 and/or conductive vias 110 of the RDL 106 that is later formed, for example.

A plurality of the integrated circuit dies 152 is coupled to the carrier 102 between some of the plurality of through-vias 156 in some embodiments. One integrated circuit die 152 is shown in the drawings; in some embodiments, a plurality of the integrated circuit dies 152 is coupled to the carrier 102 and is packaged simultaneously. The plurality of integrated circuit dies 152 may be coupled to the carrier 102 using a die attach film (DAF) (not shown) disposed on a bottom surface of the integrated circuit dies 152 in some embodiments. The plurality of integrated circuit dies 152 may be placed on the carrier 102 using a pick-and-place machine or manually, for example. The integrated circuit dies 152 or two or more integrated circuit dies 152 are later singulated along scribe lines (i.e., of the package or interconnect structure 100) to form a plurality of packaged semiconductor devices 150. The integrated circuit die 152 includes contact pads 153 formed on a top surface thereof that are used to electrically connect to portions of the RDL 106, such as conductive vias 110, as illustrated in FIG. 12, in some embodiments.

The molding material 154 is then formed over the carrier 102, over the integrated circuit die 152 and the through-vias 156, in embodiments wherein the through-vias 156 are included. The molding material 154 may comprise a molding compound comprised of an insulating material, such as an epoxy, a filler material, a stress release agent (SRA), an adhesion promoter, other materials, or combinations thereof, as examples. The molding material 154 may comprise a liquid or gel when applied so that it flows between a plurality of the integrated circuit dies 152 being simultaneously packaged and around the through-vias 156, in some embodiments. The molding material 154 is then cured or allowed to dry so that it forms a solid. A molding compound clamp may be applied during a curing process and a plasma treatment process of the molding material 154 in some embodiments. In some embodiments, as deposited, the molding material 154 extends over top surfaces of the plurality of integrated circuit dies 152 and the through-vias 156, and after the molding material 154 is applied, a top portion of the molding material 154 is removed using a planarization process, such as a chemical mechanical polish (CMP) process, a grinding process, an etch process, or combinations thereof, as examples. Other methods may also be used to planarize the molding material 154. A top portion of the integrated circuit dies 152 and/or through-vias 156 may also be removed during the planarization process for the molding material 154. In some embodiments, an amount of the molding material 154 applied may be controlled so that top surfaces of the integrated circuit dies 152 and through-vias 156 are exposed. Other methods may also be used to form the molding material 154.

The interconnect structure 100 may then be formed over the planarized molding material 154, the integrated circuit dies 152, and the through-vias 156. The interconnect structure 100 comprises the RDL 106 and/or a PPI in some embodiments. The interconnect structure 100 may include one, two, or several conductive line layers and via layers. Some of the conductive lines 108 and/or conductive vias 110 of the interconnect structure 100 are coupled to contact pads 153 of the integrated circuit die 152.

The carrier 102 wafer is then removed in some embodiments. In some embodiments, a plurality of the packaged semiconductor devices 150 is then singulated to form the packaged semiconductor device 150 shown in FIG. 12. The packaged semiconductor devices 150 may be singulated using a saw or laser (not shown), which may include a blade comprising diamond or other materials in some embodiments, for example. One or more carriers 102 may be used to package a semiconductor device.

Figure 13:
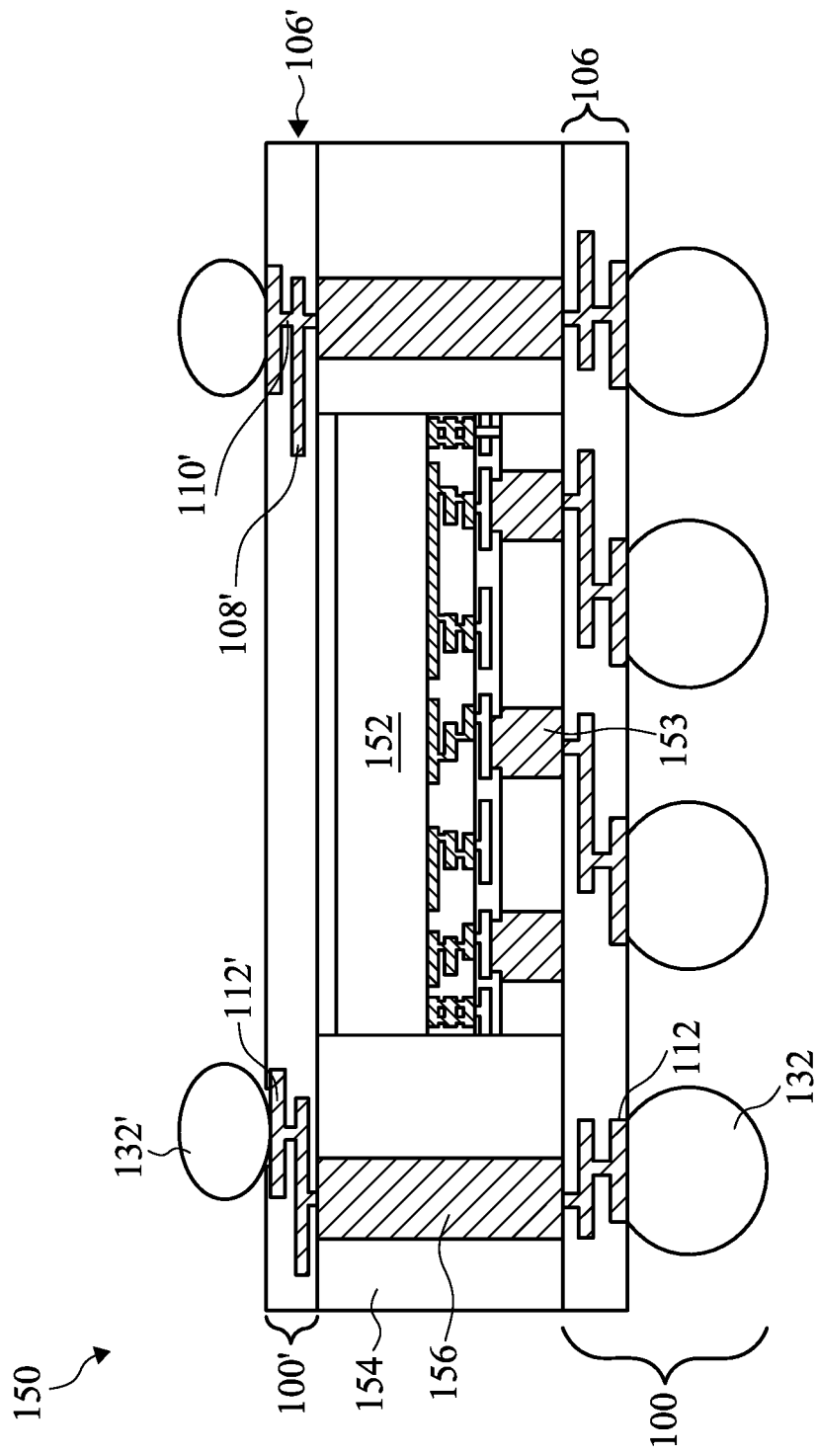
FIG. 13 is a cross-sectional view illustrating a packaged semiconductor device in accordance with some embodiments.

FIG. 13 is a cross-sectional view of a packaged semiconductor device 150 in accordance with some embodiments. The packaged semiconductor device 150 shown in FIG. 13 has been inverted from the view of the packaged semiconductor device 150 shown in FIG. 12, for example. The interconnect structure 100 comprises a first interconnect structure 100 of the packaged semiconductor device 150, and a second interconnect structure 100' has been formed on an opposite side of the packaged semiconductor device 150 from the first interconnect structure 100. A plurality of connectors 132' is coupled to the second interconnect structure 100' of the packaged semiconductor device 150 in some embodiments.

In some embodiments, the second interconnect structure 100' may comprise similar elements as described for the first interconnect structure 100 (i.e., interconnect structure 100 shown in FIG. 11). For example, the second interconnect structure 100' may include an RDL 106' that comprises a plurality of conductive lines 108' and conductive vias 108'. UBM pads 112' that comprise a surface with an increased second surface roughness may be coupled to some of the conductive lines 108' and/or conductive vias 108'. A connector 132' may be coupled to each of the UBM pads 112'. In some embodiments, the plurality of connectors 132' is not coupled to the second interconnect structure 100'. In some embodiments, the second interconnect structure 100' may not include UBM pads 112' having an increased second surface roughness.

A plurality of the connectors 132 and/or a plurality of the connectors 132' may be used to couple the packaged semiconductor device 150 to another device, another packaged semiconductor device 150, or to a board or other object in an end application, for example. The plurality of connectors 132 and/or the plurality of connectors 132' may be used to couple the first interconnect structure 100 or the second interconnect structure 100', respectively, of the packaged semiconductor device 150 to a packaged integrated circuit, as another example.

In some embodiments, to form the second interconnect structure 100', the previously described carrier 102 may comprise a first carrier 102, and after the formation of the first interconnect structure 100, a second carrier (not shown) may be attached to the first interconnect structure 100. The first carrier 102 is removed, and the second interconnect structure 100' is formed over the second side of the integrated circuit die 152, the through-vias 156, and the molding material 154. The second carrier is then removed, and the plurality of packaged semiconductor devices 150 are then singulated. The first interconnect structure 100 and the second interconnect structure 100' may provide electrical connections in a horizontal direction for a plurality of packaged semiconductor devices 150 in some embodiments, for example. The second interconnect structure 100' may comprise back-side routing, and the first interconnect structure 100 may comprise front-side routing, or vice versa, e.g., relative to the integrated circuit die 152, for the packaged semiconductor devices 150 in some embodiments.

The methods of packaging semiconductor devices using one or more carriers 102 described herein are merely examples: the integrated circuit dies 152 may be packaged using different methods or orders of methods of a packaging process.

In some embodiments wherein a second interconnect structure 100' is included, another packaged integrated circuit or semiconductor device may be coupled to the first interconnect structure 100 and/or the second interconnect structure 100' of the packaged semiconductor device 150, for example.

Figure 14:
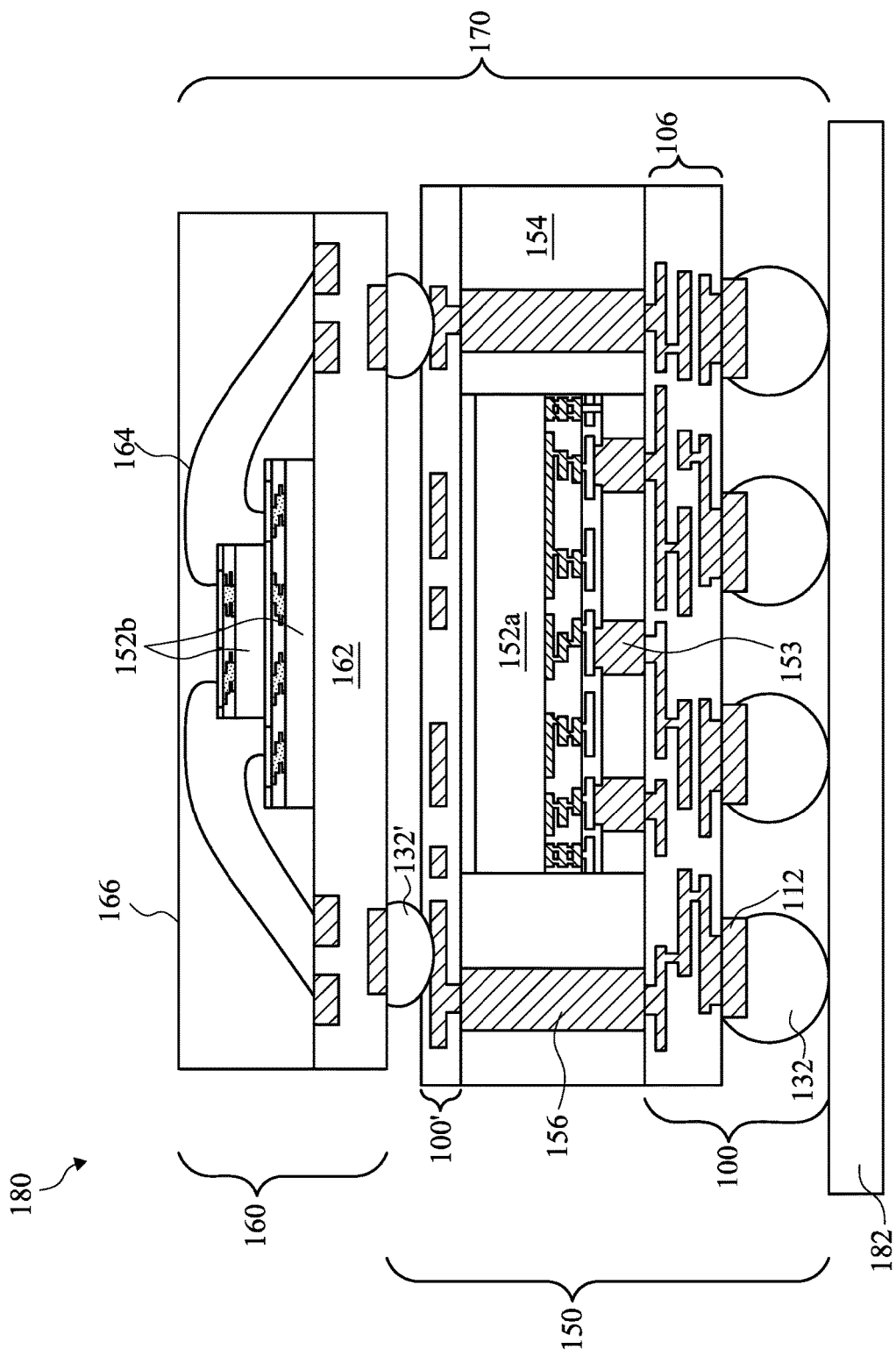
FIG. 14 shows a cross-sectional view of a package-on-package (POP) device in accordance with some embodiments.

For example, FIG. 14 is a cross-sectional view of a package-on-package (POP) device 170 in accordance with some embodiments. The POP device 170 includes a packaged semiconductor device 150 that is inverted from the view shown in FIG. 12, for example. The POP device 170 includes a packaged semiconductor device 150 shown in FIG. 13 that has been coupled to another packaged semiconductor device 160 using a plurality of connectors 132' coupled to the second interconnect structure 100'.

To manufacture the POP device 170, in some embodiments, before the packaged semiconductor devices 150 shown in FIG. 13 are singulated, and after the second interconnect structure 110' is formed, a plurality of the second packaged semiconductor devices 160 is provided, and each of the plurality of second packaged semiconductor devices 160 is coupled to one of the first packaged semiconductor devices 150 using the plurality of connectors 132'. The plurality of second packaged semiconductor devices 160 is coupled to the unsingulated plurality of first packaged semiconductor devices 150 by a method such as manually by an operator or technician, by the use of an automated machine such as a pick-and-place machine, or other methods. The eutectic material of the connectors 132' is heated, reflowing the eutectic material, and after the eutectic material cools, the second packaged semiconductor devices 160 are electrically and mechanically coupled to the first packaged semiconductor devices 150. The plurality of first packaged semiconductor devices 150 is then singulated to form a plurality of the POP devices 170, one of which is illustrated in FIG. 14.

The second packaged semiconductor device 160 may comprise a substrate 162 that includes a plurality of contact pads disposed on. The plurality of contact pads is disposed on a top surface and a bottom surface of the substrate 162 in FIG. 14, for example. The substrate 162 may include one or more interconnect structures (not shown) formed thereon that provide horizontal connections for the second packaged semiconductor device 160 in some embodiments. The substrate 162 may also include a plurality of through-vias (also not shown) formed therein. One or more integrated circuit dies 152b may be coupled to a top surface of the substrate 162. The second packaged semiconductor device 160 comprises two vertically stacked integrated circuit dies 152b in some of the embodiments shown in FIG. 14, for example. Two or more integrated circuit dies 152b may also be packaged together horizontally in the second packaged semiconductor device 160 in some embodiments, not shown.

In some of the embodiments shown in FIG. 14, the integrated circuit dies 152b are coupled to a plurality of contact pads disposed on the top surface of the substrate 162 by bond wires 164. The bond wires 164 and through-vias in the substrate 162, if included, provide vertical electrical connections for the second packaged semiconductor device 160 in some embodiments. A molding material 166 is disposed over the integrated circuit dies 152b, the bond wires 164, and the substrate 162. The molding material 166 may comprise similar materials and formation methods as described for the molding material 154 of the first packaged semiconductor device 150, for example.

In some embodiments, the integrated circuit die or dies 152b of the second packaged semiconductor device 160 may comprise memory devices, such as dynamic random access memory (DRAM) devices, for example. The integrated circuit dies 152b may also comprise other types of memory devices and/or other types of devices. The integrated circuit dies 152b may be packaged in a wire bond type of package as shown in FIG. 14, or the integrated circuit dies 152b may be packaged in other types of packages and using other types of packaging techniques. The second packaged semiconductor device 160 may also comprise a similar type or the same type of package as the first packaged semiconductor device 150. The second packaged semiconductor device 160 may comprise UBM pads 112 having the increased second surface roughness 118, for example.

The POP device 170 may be coupled to another device or object using the plurality of connectors 132 disposed on the bottom surface of the POP devices 170 that are coupled to the interconnect structure 100, e.g., using a surface mount technology (SMT) process. In some embodiments, the POP devices 170 may be coupled to a substrate or PCB 182, as shown in FIG. 14, forming a chip-on-wafer-on-substrate (CoWoS) device 180.

In some embodiments, the integrated circuit dies 152a of the first packaged semiconductor device 150 may comprise logic devices or processors, and the interconnect structure 100 of the first packaged semiconductor device 150 comprises fan-out wiring, e.g., in some embodiments wherein the second integrated circuit dies 152b comprise memory devices such as DRAM devices, forming an InFO POP device 170. The first integrated circuit dies 152a, the second integrated circuit dies 152b, the first packaged semiconductor device 150, and the second packaged semiconductor device 160 may also comprise other types of devices, and the connector pad structures 101 comprising a plurality of UBM pads 112 with the increased second surface roughness 118 described herein may also be implemented in other types of applications.

Figure 15:
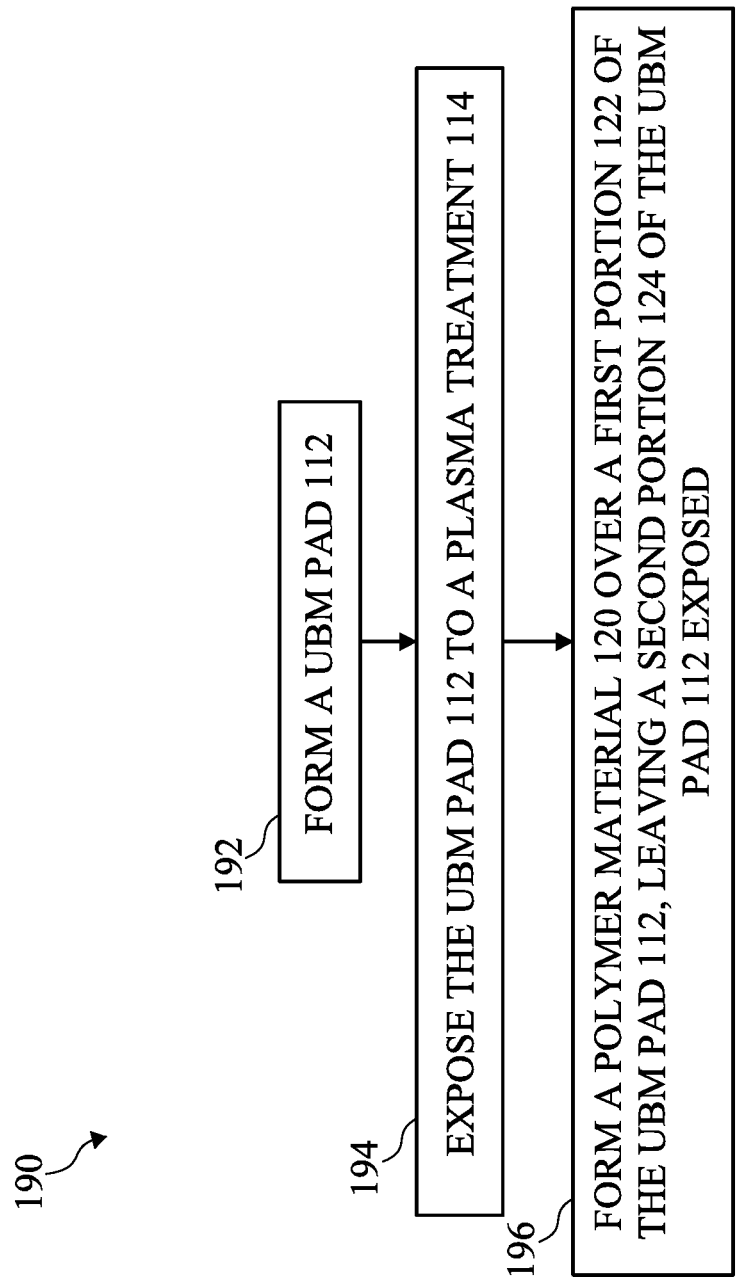
FIG. 15 is a flow chart that illustrates a method of forming a connector pad structure in accordance with some embodiments of the present disclosure.

FIG. 15 is a flow chart 190 of a method of forming a connector pad structure 101 (see FIG. 3) in accordance with some embodiments of the present disclosure. In step 192, a UBM pad 112 is formed, as also shown in FIG. 1. In step 194, the UBM pad 112 is exposed to a plasma treatment 114, as shown in FIGS. 1 and 2. In step 196, a polymer material 120 is formed over a first portion 122 of the UBM pad 112, leaving a second portion 124 of the UBM pad 112 exposed, as shown in FIG. 3.

Some embodiments of the present disclosure are advantageously implementable in and are particularly beneficial when used in POP devices, in some applications. The packaged semiconductor devices may comprise POP devices 170, system-on-a chip (SOC) devices, CoWoS devices, or other types of three dimensional integrated circuits (3DICs) in some embodiments, as examples. Some embodiments of the present disclosure are also beneficial for and may be implemented in other types of devices that include interconnect structures and fan-out structures, as other examples. Some embodiments are also beneficial in ball mount applications and/or connector mounting applications, for example.

Some embodiments of the present disclosure include connector pad structures and interconnect structures that include the UBM pads having an increased second surface roughness resulting from the plasma treatment, and methods of formation thereof. Other embodiments include packaged semiconductor devices that include the connector pad structures and interconnect structures that include UBM pads having the increased second surface roughness resulting from the plasma treatment, and methods of packaging thereof.

Advantages of some embodiments of the present disclosure include providing low cost methods of improving reliability performance of connector pad structures and interconnect structures of packaging devices. Plasma treatment of a UBM pad surface and a low-activity flux are used to prevent or reduce IMC penetration to a polymer material and UBM pad surface interface. The plasma treatment roughens the UBM pad surface, which may improve adhesion, and which prevents or reduces delamination between the polymer material and UBM pad interface region in some embodiments. The more robust interface between the polymer material and the UBM pad results in reduced reliability test failure issues in some embodiments, for example.

Improved reliability interconnect structures with fan-out structures are achieved in some embodiments. Treatment costs for various material layers of connector pad structures and interconnect structures can be lowered in some embodiments, for example. Ball mount processes (e.g., of the connectors) with high yields are advantageously achievable by implementing some embodiments of the present disclosure. Furthermore, the methods and structures described herein are easily implementable into existing interconnect structure and packaging process flows and structures.

In some embodiments, a method of forming a connector pad structure includes forming a UBM pad, and increasing a surface roughness of the UBM pad by exposing the UBM pad to a plasma treatment. A polymer material is formed over a first portion of the UBM pad, leaving a second portion of the UBM pad exposed.

In some embodiments, a method of forming an interconnect structure includes forming an RDL, and forming a UBM pad over a portion of the RDL. A top surface of the UBM pad has a first surface roughness. The method includes altering the first surface roughness of the top surface of the UBM pad to a second surface roughness, the second surface roughness being greater than the first surface roughness. A polymer material is formed over a first portion of the UBM pad. A connector is formed over a second portion of the UBM pad. A material of the connector is reflowed.

In some embodiments, an interconnect structure includes an RDL and a UBM pad disposed over a portion of the RDL. A surface of the UBM pad has a surface roughness of about 0.18 μm to about 0.25 μm. A polymer material is disposed over a first portion of the surface of the UBM pad, and an IMC is disposed over a second portion of the surface of the UBM pad. A connector is disposed over the IMC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first redistribution layer (RDL);
an underball metallization (UBM) pad disposed over a portion of the first RDL, a rough surface of the UBM pad having a surface roughness, wherein the surface roughness is approximately 0.18 μm to approximately 0.25 μm;
a polymer material disposed over a first portion of the rough surface of the UBM pad;
an intermetallic compound (IMC) disposed over a second portion of the rough surface of the UBM pad; and
a connector disposed over the IMC.

2. The structure of claim 1, wherein the connector comprises Sn.

3. The structure of claim 2, wherein the IMC comprises CuSn.

4. The structure of claim 1, further comprising an integrated circuit die coupled to the RDL, wherein portions of the RDL are coupled to contact pads of the integrated circuit die.

5. The structure of claim 4, further comprising:
molding material disposed around the integrated circuit die, the RDL extending over the integrated circuit die and the molding material; and
plurality of through vias disposed within the molding material.

6. The structure of claim 5, wherein the integrated circuit die comprises a first side and a second side opposite the first side, wherein the first RDL is proximate the first side of the integrated circuit die, and further comprising a second RDL proximate the second side of the integrated circuit die.

7. The structure of claim 6, further comprising a packaged integrated circuit coupled to the first RDL or the second RDL.

8. A semiconductor device comprising:
an integrated circuit die comprising a first connector pad and a second connector pad;
a first underball metallization (UBM) pad electrically coupled to the first connector pad, the first UBM pad comprising a first rough surface, the first rough surface having a first surface roughness, wherein the first surface roughness is approximately 0.18 μm to approximately 0.25 μm;
a second UBM pad electrically coupled to the second connector pad, the second UBM pad comprising a second rough surface, the second rough surface having a second surface roughness, wherein the second surface roughness is approximately 0.18 μm to approximately 0.25 μm;
a first polymer material disposed over a first portion of the first rough surface of the first UBM pad;
a second polymer material disposed over a first portion of the second rough surface of the second UBM pad, the first polymer material being separate from the second polymer material;
a first connector disposed over the first UBM pad;
a second connector disposed over the second UBM pad;

a first intermetallic compound (IMC) interposed between a second portion of the first rough surface of the first UBM pad and the first connector; and a second IMC interposed between a second region of the second rough surface of the second UBM pad and the second connector.

9. The semiconductor device of claim 8, further comprising a molding material disposed around the integrated circuit die.

10. The semiconductor device of claim 9, further comprising a plurality of through vias disposed within the molding material.

11. The semiconductor device of claim 10, wherein the first UBM is laterally over the molding material.

12. The semiconductor device of claim 9, further comprising an insulating material layer disposed over the integrated circuit die and the molding material, wherein a bottommost surface of the first polymer material and a bottommost surface of the second polymer material are lower than an uppermost surface of the insulating material layer.

13. The semiconductor device of claim 8, wherein a portion of the first polymer material is formed on sidewalls of the first UBM pad and a portion of the second polymer material is formed on sidewalls of the second UBM pad.

14. The semiconductor device of claim 13, wherein the portion of the first polymer material is along a periphery of the second portion of the first UBM pad and the portion of the second polymer material is along a periphery of the second portion of the second UBM pad.

15. The semiconductor device of claim 8, wherein the first UBM pad is electrically coupled to the first connector pad through a first plurality of conductive lines and a first plurality of conductive vias.

16. A semiconductor device comprising:
an integrated circuit die comprising a first side and a second side opposite the first side, the first side comprising a plurality of contact pads;
a first interconnect structure on the first side of the integrated circuit die, the first interconnect structure comprising:
a plurality of first underball metallization (UBM) pads, each of the plurality of first UBM pads comprising a first rough surface having a first surface roughness, wherein the first surface roughness is approximately 0.18 μm to approximately 0.25 μm; and
a plurality of first polymer structures, each of the plurality of first polymer structures being disposed over a first portion of the first rough surface of respective ones of the plurality of first UBM pads;
a second interconnect structure on the second side of the integrated circuit die, the second interconnect structure comprising a plurality of second UBM pads, wherein at least one of the plurality of second UBM pads is electrically coupled to a second subset of the plurality of first UBM pads by a through via;
a plurality of first connectors, each of the plurality of first connectors disposed over a second portion of the first rough surface of respective ones of the plurality of first UBM pads; and
a plurality of second connectors, each of the plurality of second connectors disposed over respective ones of the plurality of second UBM pads.

17. The semiconductor device of claim 16, further comprising a molding material disposed around the integrated circuit die.

18. The semiconductor device of claim 17, wherein the through via is disposed in the molding material.

19. The semiconductor device of claim 16, wherein each of the plurality of second UBM pads comprise a fourth rough surface having a second surface roughness, wherein the second surface roughness is approximately 0.18 μm to approximately 0.25 μm, further comprising a plurality of second polymer structures, each of the plurality of second polymer structures is disposed over a first portion of the fourth rough surface of respective ones of the plurality of second UBM pads, wherein the plurality of second connectors is disposed over a second portion of the fourth rough surface of respective ones of the plurality of second UBM pads.

20. The semiconductor device of claim 16, wherein the first interconnect structure further comprises a plurality of intermetallic compounds (IMC) interposed between the plurality of first UBM pads and the plurality of first connectors.

* * * * *